July 8, 1958 R. E. MARSH 2,842,624

TRANSISTOR AMPLIFIER CIRCUIT

Filed March 5, 1954

Inventor
Richard E. Marsh
By Schroeder, Hofgren, Brady & Wegner
Attorneys

United States Patent Office 2,842,624

Patented July 8, 1958

2,842,624

TRANSISTOR AMPLIFIER CIRCUIT

Richard E. Marsh, Oak Park, Ill., assignor to The Hallicrafters Co., a corporation of Delaware Application March 5, 1954, Serial No. 414,410

3 Claims. (Cl. 179—171)

This invention relates to an amplifier circuit and more particularly to an amplifier utilizing semi-conductor amplifying devices.

Recent research in the field of solid state physics and particularly with regard to the properties of semiconductors has led to the development of semiconductor amplifying devices commonly referred to as transistors. The transistors are of two general types, the point contact transistor disclosed in Bardeen et al. Patent No. 2,524,035 and the junction transistor disclosed in Shockley Patent 2,569,347.

It is a major feature of this invention to make efficient use of both types of transistor amplifiers in a two-stage amplifier unit.

Another feature is that the first stage of the amplifier includes a junction transistor and the second stage includes a point contact transistor. A further feature is that the junction transistor in the first or input stage is connected for grounded collector operation while the point contact transistor in the second or output stage is connected for grounded base operation. Still another feature is that the semiconductor transistor in the first stage has emitter and collector portions of one conductivity type and an intermediate base portion of the opposite conductivity type while the point contact transistor in the second stage has a body portion of the same conductivity type as the emitter and collector portions of the semiconductor transistor, the emitters of both of said transistors being conductively coupled, and means are provided for biasing the collector of the junction transistor in the relatively nonconducting direction, this means also providing bias for the emitters of both transistors. Still another feature is that a plurality of two-stage amplifier sections may be cascaded to provide greater amplification.

Further features and advantages will readily be apparent from the following specification and from the drawings in which.

Figure 1:
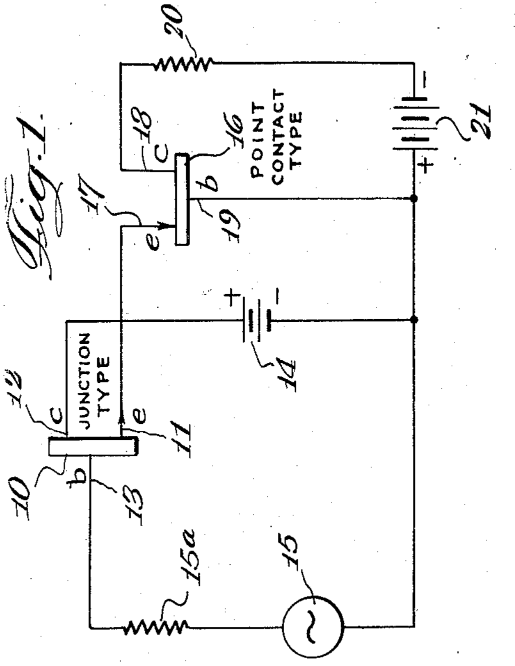
Figure 1 is a schematic diagram representing the A. C. conditions of an embodiment of the invention.

Referring now to Figure 1 which represents only the A. C. portions of the amplifier circuit, reference numeral 10 indicates a junction transistor having an emitter portion 11, collector portion 12 and intermediate base portion 13. As described in greater detail in the aforementioned patent to Shockley, the emitter and collector portions 11 and 12 respectively of the junction transistor are of a semiconductor material of one conductivity type, either n-type or p-type, while the intermediate base portion 13 is of the opposite conductivity type. In the illustrated embodiment, the junction transistor 10, which is connected for grounded collector operation, is of the "npn" type and the collector 12 is biased in the nonconducting or reverse direction by battery 14. A signal to be amplified may be applied to the base 13 of the junction transistor 10 from a suitable source 15; reference numeral **15*a* indicating the internal impedance of the source 15**.

The output of the first stage of the amplifier is derived from the emitter 11 and is coupled to the second stage of the amplifier, point contact transistor 16, through the emitter 17 thereof. As described in the aforementioned Bardeen et al. patent, the point contact transistor comprises a semiconductive body of either n-type or p-type material to which the emitter 17 and collector 18 make rectifying contact while a base connection 19 makes a low resistance contact.

The point contact transistor 16 is connected for grounded base operation with the input signal being applied to the emitter 17 as previously described and the amplified output signal being developed across a load 20 connected to the collector 18. In this particular embodiment the point contact transistor is of the "n" type and collector 18 is biased in the reverse by a battery 21.

This particular circuit arrangement has a number of important advantages. It is desirable in most uses that an amplifying unit have both a high input impedance and a high output impedance in order to facilitate matching to various input and output circuits which may be used. The input or first stage of this amplifying unit has a relatively high input impedance by virtue of the grounded collector connection, while the output impedance of the stage is relatively low.

Although such a low output impedance would ordinarily be undesirable, it is not objectionable in this case as the second or output stage of the amplifier has a relatively low input impedance. Thus, a matched condition is easily achieved. The output impedance of the amplifier unit, that is the output impedance of the grounded base stage, is relatively high, a desirable condition as pointed out above.

The use of a junction transistor in the first or input stage, rather than a point contact transistor, is preferable inasmuch as the junction transistor creates much less internal noise than does a comparable point contact transistor. This is always an important consideration in the input section of an amplifier.

Proper choice of the transistors, in this case an "npn" transistor for the first stage and an n-type point contact transistor for the second stage permits direct coupling of the circuits of the two emitters and enables the use of a single bias source to provide the bias for the junction transistor and for the emitter circuit of the point contact transistor. Thus, maximum utilization of the available power of the bias source is realized. This could also be achieved by using a "pnp" junction transistor with a p-type point contact transistor and merely reversing the polarity of the bias source.

In this amplifier the output or emitter circuit of the junction transistor effectively loads the input of emitter circuit of the point contact transistor and prevents any possible instability which is troublesome in an amplifier utilizing two point contact transistors. Furthermore, the current gain of this circuit is greater than would be obtainable by using two point contact transistors, as the grounded collector connection of the junction transistor is a very high gain circuit. It is desirable, however, to use a point contact transistor in the output stage in order to provide the desired high output power capacity and a relatively high output impedance to facilitate matching.

Figure 2:
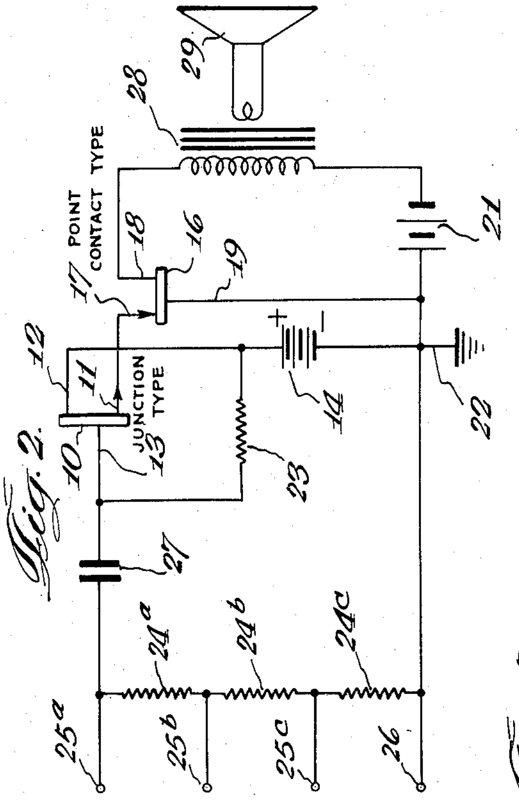
Figure 2 is a complete schematic diagram of an embodiment of the invention.

A complete schematic circuit diagram of the amplifier of Figure 1 is shown in Figure 2 and the same reference numerals will be used to indicate like portions of the circuit. The particular values of circuit components and transistor type designations indicated are intended for illustration only and many changes will readily be apparent to those skilled in the art. The first or input stage of the amplifier is an npn junction transistor of the type 2517 produced by Germanium Products Corporation. The collector 12 of the junction transistor is connected through a bias source 14 of 4.5 volts to a common ground connection 22. Resistor 23, 220,000 ohms, is connected between base 13 and collector 12 to increase the collector bias current. A resistive impedance matching network is provided in the input and comprises resistors 24*a*, 10,000 ohms, 24*b*, 470,000 ohms, and 24*c*, 470,000 ohms connected between the circuit of base 13 and ground. The input signal to be amplified may be connected between one of terminals 25*a*, 25*b* or 25*c* and terminal 26 or ground. Capacitor 27, 1 $\mu$f. (microfarad), isolates the amplifier from the input circuit so far as direct current is concerned.

The output of the junction transistor 10 is developed in the circuit of the emitter 11 which is directly, conductively coupled to the emitter 17 of the second stage of the amplifier, an n-type point contact transistor 16 which may be a type TA165 (RCA designation). The base 19 of the point contact transistor 16 is connected to the reference potential or ground 22 and the output is coupled through a matching transformer 28, connected to the collector 18, to a loud speaker 29. A battery 21, 18.5 volts, has its negative terminal connected to the collector 18 biasing it in the nonconducting direction.

As pointed out above, the bias means or battery 14 furnishes the bias current for the collector 12 and emitter 11 of the junction transistor and for the emitter 17 of the point contact transistor. This is possible since the emitter and collector portions of the junction transistor and the body portion of the point contact transistor are of the same conductivity type material, in this case "n-type." A pnp junction transistor and a p-type point contact transistor might be coupled in the same manner.

Figure 3:
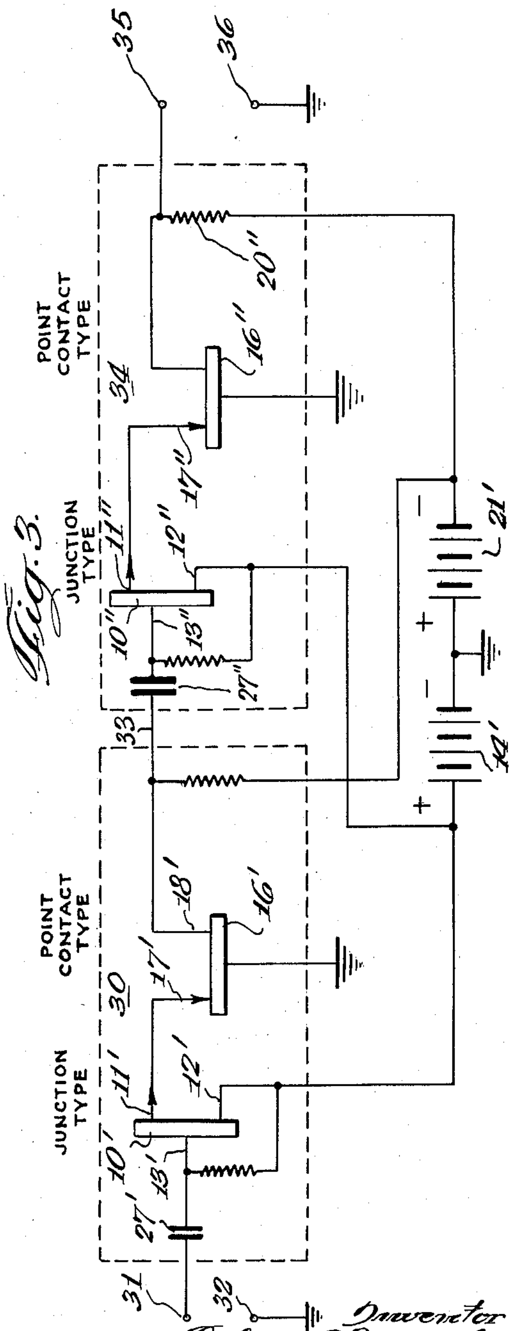
Figure 3 is a schematic diagram of two cascaded amplifier sections.

Figure 3 shows a cascaded amplifier utilizing two units of the type shown in Figures 1 and 2, both units using the same bias sources. In the first unit 30 the first stage is an npn junction transistor 10′ connected for grounded collector operation. The input signal may be applied between terminals 31 and 32 through a coupling capacitor 27′ to the base 13′ of transistor 10′. The junction transistor is operably biased by a battery 14′ connected to the collector 12′. The output of the first stage is developed in the circuit of the emitter 11′ and is coupled directly to the emitter 17′ of point contact transistor 16′ which is connected for grounded base operation. The output of the amplifier unit 30 is developed in the circuit of the collector 18′ of the second stage, and is coupled through a connection 33 to the second unit of the amplifier 34. The collector circuit of the transistor 16′ is operably biased by a suitable battery 21′.

The second unit 34 is identical with the first unit 30 and has an npn junction transistor 10″ comprising the input stage and connected for grounded collector operaiton. The signal is again coupled through a blocking capacitor 27″ to the base 13″; the emitter 12″ is connected to bias battery 14′ and the output is derived from the collector 11″. The output signal is coupled directly to the emitter 17″ of the point contact transistor 16″, connected for grounded base operation, and the output of unit 34 is developed across resistor 20″ and may be obtained between terminals 35 and 36. If desired, the units may be directly coupled by eliminating capacitor 27″.

While I have shown and described certain embodiments of my invention, it is to be understood that it is capable of many modifications. Changes, therefore, in the construction and arrangement may be made without departing from the spirit and scope of the invention as disclosed in the appended claims.

I claim:

1. An amplifier of the character described, comprising: a first stage including a semiconductor junction transistor having emitter and collector portions of one conductivity type and an intermediate base portion of the opposite conductivity type and being connected for grounded collector operation; a second stage including a semiconductor point contact transistor having a body portion of said one conductivity type and having emitter, collector and base electrodes operably associated therewith, said point contact transistor being connected for grounded base operation; means conductively coupling both of said emitters; and means biasing the collector of said first stage in the non-conducting direction, said means also providing bias for both of said emitters.

2. A two-stage amplifier of the character described, comprising: a first stage including a semiconductor junction transistor having an emitter portion and a collector portion of a first conductivity type and an intermediate base portion of the opposite conductivity type; a second stage including a point contact transistor having a semiconductor body and provided with an emitter electrode, a collector electrode and a base electrode; means coupling the emitters of both of said transistors; means for biasing the collector portion of said junction transistor in the non-conducting direction, said means also effecting bias of both of said emitters in the conducting direction; means for biasing the collector of said point contact transistor in the non-conducting direction; means for applying a desired signal to the base portion of said junction transistor; and means for deriving the amplified signal from the collector electrode of said point contact transistor.

3. An amplifier of the character described in claim 2 wherein the emitter and collector portions of said junction transistor and the body portion of said point contact transistor are of the same conductivity type and said emitters are conductively coupled.

References Cited in the file of this patent

UNITED STATES PATENTS

| | | |
|---|---|---|
| 2,517,960 | Barney et al. | Aug. 8, 1950 |
| 2,541,322 | Barney | Feb. 13, 1951 |
| 2,730,576 | Caruthers | Jan. 10, 1956 |

OTHER REFERENCES

Shea text: "Principles of Transistor Circuits," preface, page VII, and pages 80–82; pub. 1953 by John Wiley & Sons, Inc., New York city.

Sziklai et al.: Article: Proc. of IRE, June 1953, pages 708–717.

Coblenz et al.: Article: Electronics, January 1954, page 159.